US008378557B2

(12) United States Patent
Tai et al.

(10) Patent No.: US 8,378,557 B2
(45) Date of Patent: Feb. 19, 2013

(54) THERMAL TRANSFER AND ACOUSTIC MATCHING LAYERS FOR ULTRASOUND TRANSDUCER

(75) Inventors: Alan C. Tai, Phoenix, AZ (US); Hiroshi Isono, Tokyo (JP)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/234,658

(22) Filed: Sep. 16, 2011

(65) Prior Publication Data

US 2012/0007472 A1 Jan. 12, 2012

Related U.S. Application Data

(63) Continuation-in-part of application No. 12/833,101, filed on Jul. 9, 2010, now Pat. No. 8,232,705.

(51) Int. Cl.
*H01L 41/083* (2006.01)

(52) U.S. Cl. ........................................ 310/334; 310/335

(58) Field of Classification Search .................. 310/322, 310/334, 335
See application file for complete search history.

(56) References Cited

U.S. PATENT DOCUMENTS

2008/0262358 A1* 10/2008 Kaminski et al. ............. 600/459

* cited by examiner

*Primary Examiner* — Derek Rosenau

(57) ABSTRACT

Ultrasound transducers and methods of making ultrasound transducers with improved thermal characteristics are provided. An ultrasound transducer includes a piezoelectric element defining a front side and a back side. The ultrasound transducer includes a lens connected to the front side of the piezoelectric element, a heat sink connected to the back side of the piezoelectric element, and a backside matching layer disposed between the piezoelectric element and the heat sink. The backside matching layer is thermally connected to the piezoelectric element and the heat sink, and the backside matching layer is configured to conduct heat from the piezoelectric element to the heat sink.

4 Claims, 10 Drawing Sheets

| MATCHING LAYER | ACOUSTIC IMPEDANCE (Mrayl) | THICKNESS AS A A FUNCTION OF WAVELENGTH $\lambda$ | THERMAL CONDUCTIVITY W/mK |
|---|---|---|---|
| 203 | ABOUT 1.5 - 3 | < ABOUT 0.25 $\lambda$ | ABOUT 0.5 - 50 |
| 204 | ABOUT 2 - 8 | < ABOUT 0.25 $\lambda$ | ABOUT 0.5 - 50 |
| 205 | ABOUT 5 - 15 | < ABOUT 0.25 $\lambda$ | ABOUT 1 - 300 |
| 206 | ABOUT 10 - 20 | < ABOUT 0.22 $\lambda$ | > ABOUT 30 |

FIG. 2B

ACOUSTIC LAYERS

| FACE PLATE No | MATL NAME | SHEAR VEL. m/sec | LONG VEL m/sec | LONG IMPED. MRayls | LOSS ALPHA dB/cm | LOSS AT F MHz | LOSS N | REL AREA | THICK Lambdas At Fd | THICK mm |
|---|---|---|---|---|---|---|---|---|---|---|
| 1 | Aluminum-bar | 3641.5 | 5150.0 | 13.905 | 0.000 | 1.000 | 1.00 | 1.000 | 0.1726 | 0.2540 |
| 2 | Filled epoxy | 1727.3 | 2450.0 | 6.127 | 5.300 | 1.000 | 1.30 | 1.000 | 0.2000 | 0.1400 |
| 3 | Blank | 1600.4 | 2270.0 | 2.499 | 3.000 | 1.000 | 1.00 | 1.000 | 0.1765 | 0.1145 |

No Backplates
ACOUSTIC LOAD IMPEDANCES: Rear: 3.000 MRayls Front: 1.500 MRayls
ELECTRICAL TERMINATIONS : Transmitter output = 50.0 Ohms Receiver input = 50.0 Ohms
ELECTRICAL MATCHING NETWORK:
1. Coaxial cable 50 Ohms 2.3 m 3. dB/km at 10 MHz, 2 Series L 3.3 uH

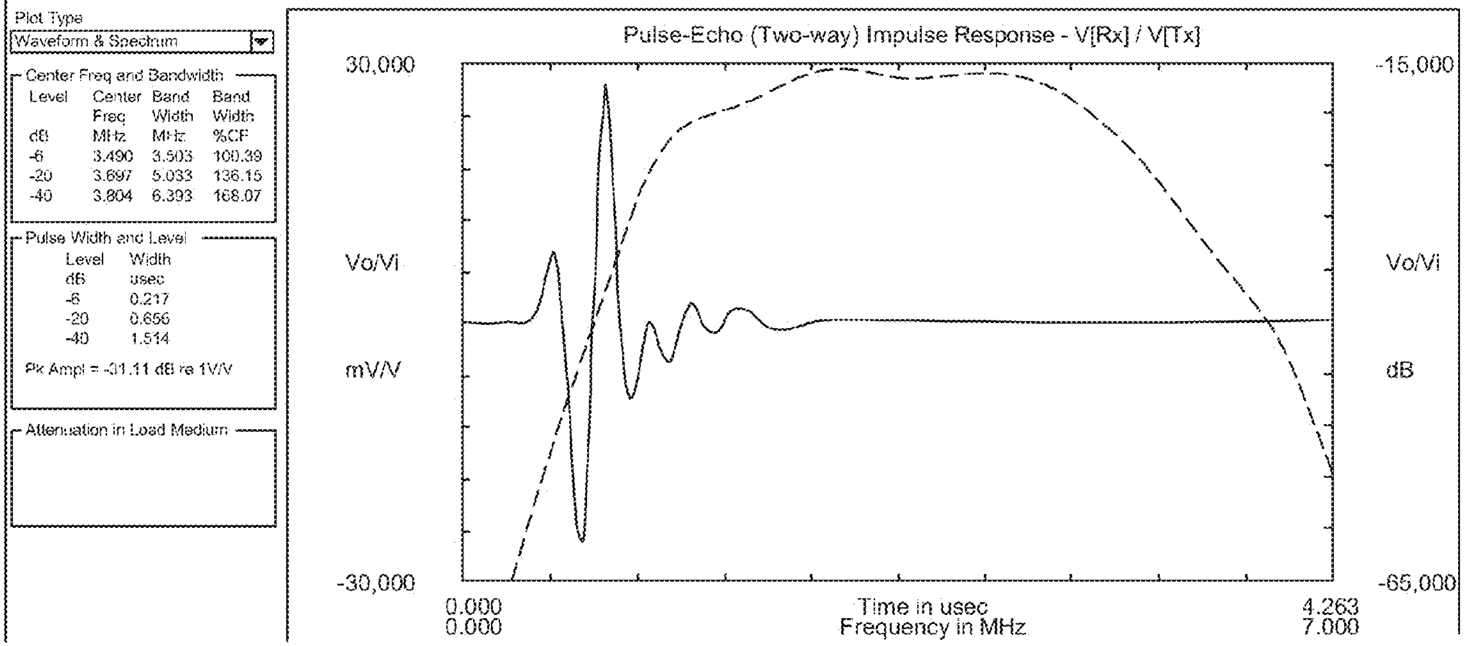

FIG. 7

THERMAL TRANSFER AND ACOUSTIC MATCHING LAYERS FOR ULTRASOUND TRANSDUCER

RELATED APPLICATIONS

This application is a continuation-in-part of and claims priority to U.S. patent application Ser. No. 12/833,101, filed on Jul. 9, 2010, the disclosure of which is incorporated herein by reference.

FEDERALLY SPONSORED RESEARCH OR DEVELOPMENT

[Not Applicable]

MICROFICHE/COPYRIGHT REFERENCE

[Not Applicable]

BACKGROUND OF THE INVENTION

Embodiments of the present technology generally relate to ultrasound transducers configured to provide improved thermal characteristics.

As depicted in FIG. 1, conventional ultrasound transducers 100 can be composed of various layers including a lens 102, impedance matching layers 104 and 106, a piezoelectric element 108, backing 110, and electrical elements for connection to an ultrasound system.

Piezoelectric element 108 can convert electrical signals into ultrasound waves to be transmitted toward a target and can also convert received ultrasound waves into electrical signals. Arrows 112 depict ultrasound waves transmitted from and received at transducer 100. The received ultrasound waves can be used by the ultrasound system to create an image of the target.

In order to increase energy out of transducer 100, impedance matching layers 104, 106 are disposed between piezoelectric element 108 and lens 102. Conventionally, optimal impedance matching has been believed to be achieved when matching layers 104, 106 separate piezoelectric element 108 and lens 102 by a distance x of about ¼ to ½ of the desired wavelength of transmitted ultrasound waves at the resonant frequency. Conventional belief is that such a configuration can keep ultrasound waves that were reflected within the matching layers 104, 106 in phase when they exit the matching layers 104, 106.

Transmitting ultrasound waves from transducer 100 can heat lens 102. However, patient contact transducers have a maximum surface temperature of about 40 degrees Celsius in order to avoid patient discomfort and comply with regulatory temperature limits. Thus, lens temperature can be a limiting factor for wave transmission power and transducer performance.

Many known thermal management techniques are focused on the backside of the transducer in order to minimize reflection of ultrasound energy toward the lens. Nonetheless, there is a need for improved ultrasound transducers with improved thermal characteristics.

BRIEF SUMMARY OF THE INVENTION

Embodiments of the present technology generally relate to ultrasound transducers and methods of making ultrasound transducers.

In an embodiment, an ultrasound transducer includes a piezoelectric element defining a front side and a back side, the piezoelectric element is configured to convert electrical signals into ultrasound waves to be transmitted from the front side toward a target, the piezoelectric element configured to convert received ultrasound waves into electrical signals. The ultrasound transducer includes a lens connected to the front side of the piezoelectric element, a heat sink connected to the back side of the piezoelectric element, and a backside matching layer disposed between the piezoelectric element and the heat sink. The backside matching layer is thermally connected to the piezoelectric element and the heat sink. The backside matching layer is configured to conduct heat from the piezoelectric element to the heat sink.

In an embodiment, an ultrasound transducer includes a piezoelectric element defining a front side and a back side. The piezoelectric element is configured to convert electrical signals into ultrasound waves to be transmitted from the front side toward a target. The piezoelectric element is configured to convert received ultrasound waves into electrical signals. The ultrasound transducer includes a lens connected to the front side of the piezoelectric element, a heat sink connected to the back side of the piezoelectric element, and a backside matching layer connected to both piezoelectric element and the heat sink. The backside matching layer includes a wing configured to extend beyond an end of the piezoelectric element to the heat sink. The backside matching layer is configured to conduct heat from the piezoelectric element to the heat sink.

In an embodiment, a method of making an ultrasound transducer includes attaching a matching layer to a front side of a piezoelectric element, attaching a backside matching layer to a back side of the piezoelectric element, and connecting the backside matching layer to a heat sink, wherein the heat sink faces the back side of the piezoelectric element.

BRIEF DESCRIPTION OF THE DRAWINGS

FIG. 2B is a table of matching layer properties for ultrasound transducers used in accordance with embodiments of the present technology.

FIG. 7 depicts computer simulation results for an ultrasound transducer used in accordance with embodiments of the present technology.

Figure 1:
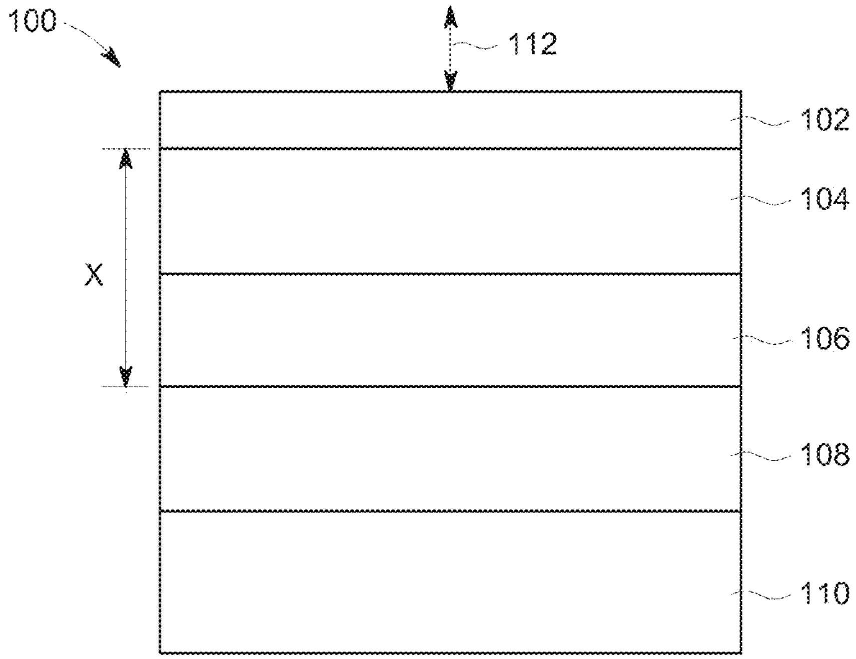
FIG. 1 (PRIOR ART)
FIG. 1 depicts a cross-section of layers of a prior art ultrasound transducer.

The foregoing summary, as well as the following detailed description of certain embodiments, will be better understood when read in conjunction with the appended drawings. For the purpose of illustrating the invention, certain embodiments are shown in the drawings. It should be understood, however, that the present invention is not limited to the arrangements and instrumentality shown in the attached drawings.

DETAILED DESCRIPTION OF CERTAIN EMBODIMENTS

Embodiments of the present technology generally relate to ultrasound transducers configured to provide improved thermal characteristics. In the drawings, like elements are identified with like identifiers.

FIG. 1 depicts a cross-section of layers of a prior art ultrasound transducer 100. Transducer 100 was described in the background, and includes two matching layers 104, 106 disposed between lens 102 and piezoelectric element 108. Matching layers 104, 106 provide a combined distance x between lens 102 and piezoelectric element 108, which distance x is about ¼ to ½ of the desired wavelength of transmitted ultrasound waves at the resonant frequency.

Figure 2A:
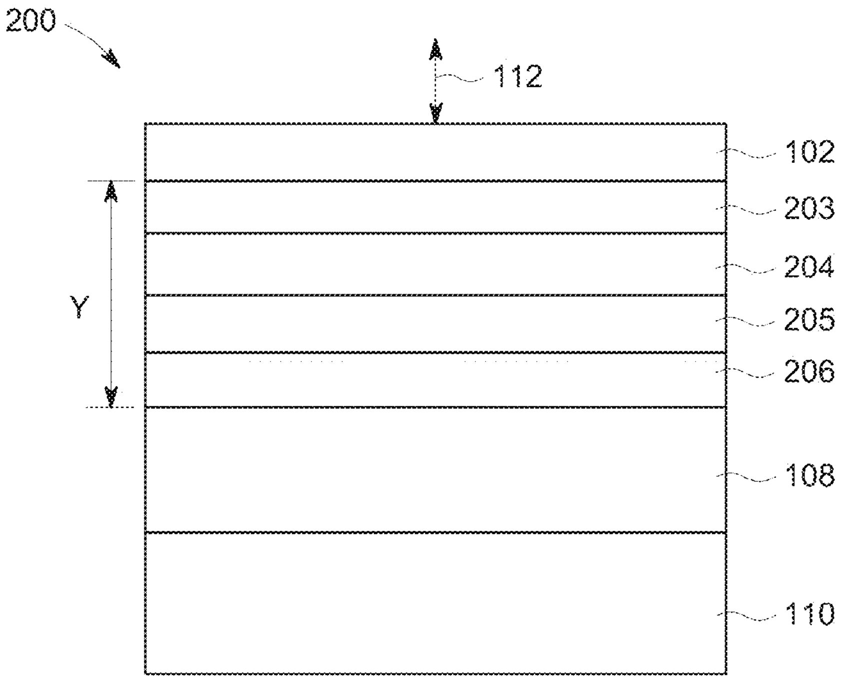
FIG. 2A depicts a cross-section of layers of an ultrasound transducer used in accordance with embodiments of the present technology.

FIG. 2A depicts a cross-section of layers of an ultrasound transducer 200 used in accordance with embodiments of the present technology. Transducer 200 includes lens 102, impedance matching layers 203-206, piezoelectric element 108, backing 110, and electrical elements for connection to an ultrasound system. Backing 110 includes heat sink and thermal management. In certain embodiments, matching layers 203-206, piezoelectric element 108 and lens 102 can be bonded together using epoxy or adhesive materials cured under pressure provided by tooling and/or a press machine, for example.

As with conventional ultrasound transducers, piezoelectric element 108 can convert electrical signals into ultrasound waves to be transmitted toward a target and can also convert received ultrasound waves into electrical signals. Arrows 112 depict ultrasound waves transmitted from and received at transducer 200. The received ultrasound waves can be used by the ultrasound system to create an image of the target.

In order to increase energy out of transducer 100, impedance matching layers 203-206 are disposed between piezoelectric element 108 and lens 102. Matching layers 203-206 separate piezoelectric element 108 and lens 102 by a distance y that can be less than or greater than the distance x (which distance is about ¼ to ½ of the desired wavelength of transmitted ultrasound waves at the resonant frequency).

As depicted in FIG. 1, conventional transducers generally include two matching layers 104, 106. Such matching layers generally comprise epoxy and fillers. It has been found that including a matching layer near the piezoelectric element that has a relatively higher acoustic impedance and a relatively higher thermal conductivity can improve thermal characteristics and/or acoustic properties. Embodiments shown herein depict inventive transducers with three or four matching layers. Nonetheless, embodiments can include as few as two matching layers and greater than four matching layers, such as five or six matching layers, for example.

FIG. 2B is a table of properties of matching layers 203-206 for embodiments of inventive ultrasound transducers. Matching layer 206, which is disposed between piezoelectric element 108 and matching layer 205, can comprise a material with an acoustic impedance of about 10-20 MRayl and thermal conductivity of greater than about 30 W/mK. Matching layer 206 can have a thickness of less than about 0.22λ, where λ is the desired wavelength of transmitted ultrasound waves at the resonant frequency. In certain embodiments, matching layer 206 can comprise a metal(s), such as copper, copper alloy, copper with graphite pattern embedded therein, magnesium, magnesium alloy, semiconductor material such as silicon, aluminum (plate or bar) and/or aluminum alloy, for example. Metals can have a relatively high acoustic impedance such that ultrasound waves travel through the layer at a higher velocity, thereby requiring a thicker matching layer to achieve desired acoustic characteristics.

Matching layer 205, which is disposed between matching layer 206 and matching layer 204, can comprise a material with an acoustic impedance of about 5-15 MRayl and thermal conductivity of about 1-300 W/mK. Matching layer 205 can have a thickness of less than about 0.25λ. In certain embodiments, matching layer 205 can comprise a metal(s), such as copper, copper alloy, copper with graphite pattern embedded therein, magnesium, magnesium alloy, aluminum (plate or bar), aluminum alloy, filled epoxy, glass ceramic, composite ceramic, and/or macor, for example.

Matching layer 204, which is disposed between matching layer 205 and matching layer 203, can comprise a material with an acoustic impedance of about 2-8 MRayl and thermal conductivity of about 0.5-50 W/mK. Matching layer 204 can have a thickness of less than about 0.25λ. In certain embodiments, matching layer 204 can comprise a non-metal, such as an epoxy with fillers, such as silica fillers, for example. In certain embodiments, matching layer 204 can comprise a graphite type material, for example. Non-metals, such as an epoxy with fillers can have a relatively low acoustic impedance such that ultrasound waves travel through the layer at a lower velocity, thereby requiring a thinner matching layer to achieve desired acoustic characteristics.

Matching layer 203, which is disposed between matching layer 204 and lens 102, can comprise a material with an acoustic impedance of about 1.5-3 MRayl and thermal conductivity of about 0.5-50 W/mK. Matching layer 203 can have a thickness of less than about 0.25λ. In certain embodiments, matching layer 203 can comprise a non-metal, such as plastic and/or an epoxy with fillers, such as silica fillers, for example.

In an embodiment, acoustic impedance of matching layers 203-206 decreases as the matching layers 203-206 increase in distance from piezoelectric element 108. That is, matching layer 206 can have a higher acoustic impedance than matching layer 205, matching layer 205 can have a higher acoustic impedance than matching layer 204, and matching layer 204 can have a higher acoustic impedance than matching layer 203. It has been found that providing three or more matching layers with acoustic impedances that decrease in this manner can provide improved acoustic properties, such as increased sensitivity and/or increased border bandwidth, for example. Such improved acoustic properties can improve detection of structures in a target, such as a human body, for example.

In an embodiment, thermal conductivity of matching layers 205, 206 is greater than thermal conductivity of matching layers 203, 204. It has been found that disposing a matching layer with a relatively high thermal conductivity (such as matching layers 205 and/or 206, for example) near piezoelectric element 108 can provide for improved thermal characteristics. For example, such matching layers can dissipate heat generated by piezoelectric element 108 more readily than matching layers of lower thermal conductivity such as matching layers 203 and 204, for example.

Figure 3:
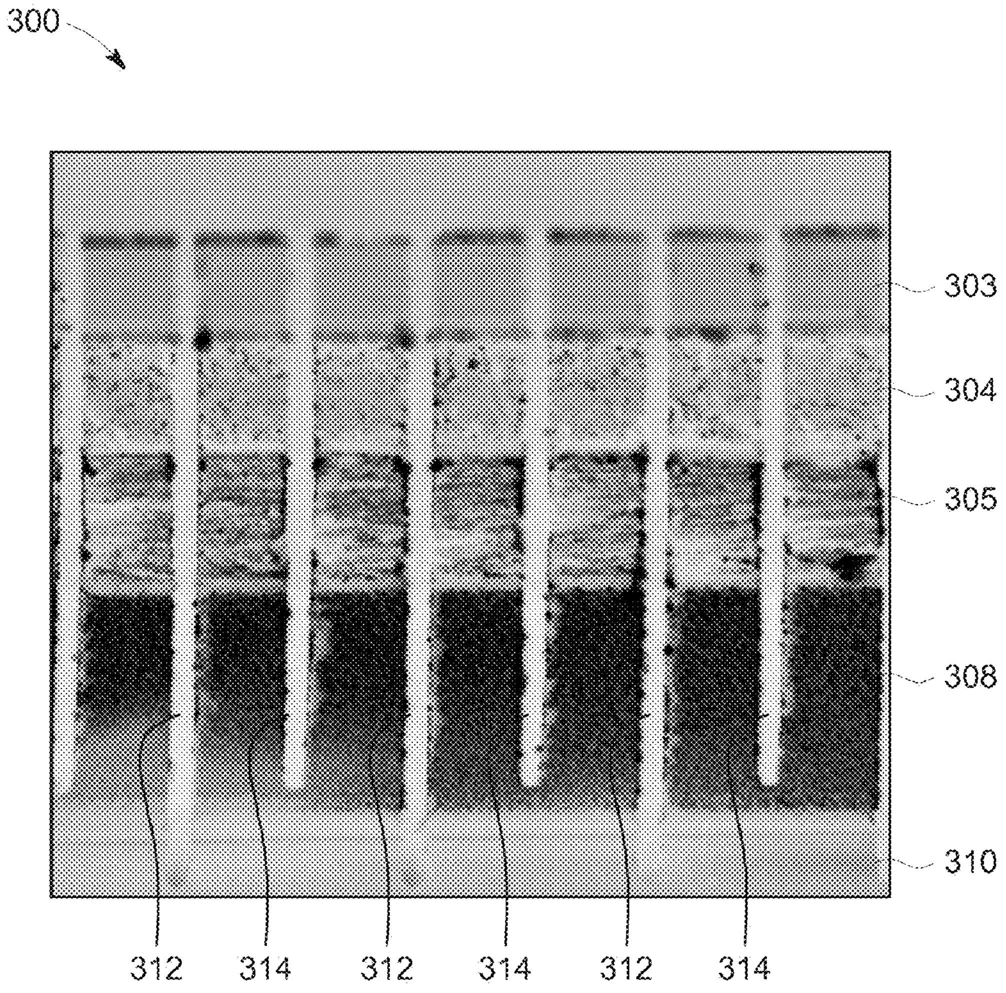
FIG. 3 depicts a cross-section of layers of an ultrasound transducer used in accordance with embodiments of the present technology.

FIG. 3 depicts a cross-section of layers of an ultrasound transducer 300 used in accordance with embodiments of the present technology. Transducer 300 includes a first impedance matching layer 303, a second impedance matching layer 304, a third impedance matching layer 305, piezoelectric element 308, and backing 310. The depicted layers include major cuts 312 and minor cuts 314. Major cuts 312 extend through matching layers 303-305, through piezoelectric element 308, and into backing 310. Major cuts 312 can provide electrical separation between portions of piezoelectric element 308. Minor cuts 314 extend through matching layers 303-305 and partially through piezoelectric element 308. Minor cuts do not extend all the way through piezoelectric element 308, and do not extend into backing 310. Minor cuts 314 do not provide electrical separation between portions of piezoelectric element 308. Minor cuts 314 can improve acoustic performance, for example, by damping horizontal vibration between adjacent portions of the layers. In certain embodiments, cuts can be provided with a cut depth to cut width ratio of about 30 to 1. In certain embodiments, major cuts can be provided with a cut depth of about 1.282 millimeters and minor cuts can be provided with a cut depth of about 1.085 millimeters, both types of cuts being provided with a cut width of about 0.045 millimeters, for example. In certain embodiments, cuts can be provided with a cut width of about 0.02 to 0.045 millimeters, for example. It has been found that minimizing thickness of matching layers 203-206 can provide improved acoustic performance by allowing dicing of the transducer layers as depicted in FIG. 3. It has also been found that minimizing thickness of matching layers 203-206 can make dicing possible with a cut depth to cut width ratio of less than 30 to 1. Using current dicing technology, such as dicing using a dicing saw, it is difficult to obtain a cut depth to cut width ratio that is greater than 30 to 1. Cuts can be made in transducer layers using lasers or other known methods, for example.

Figure 4:
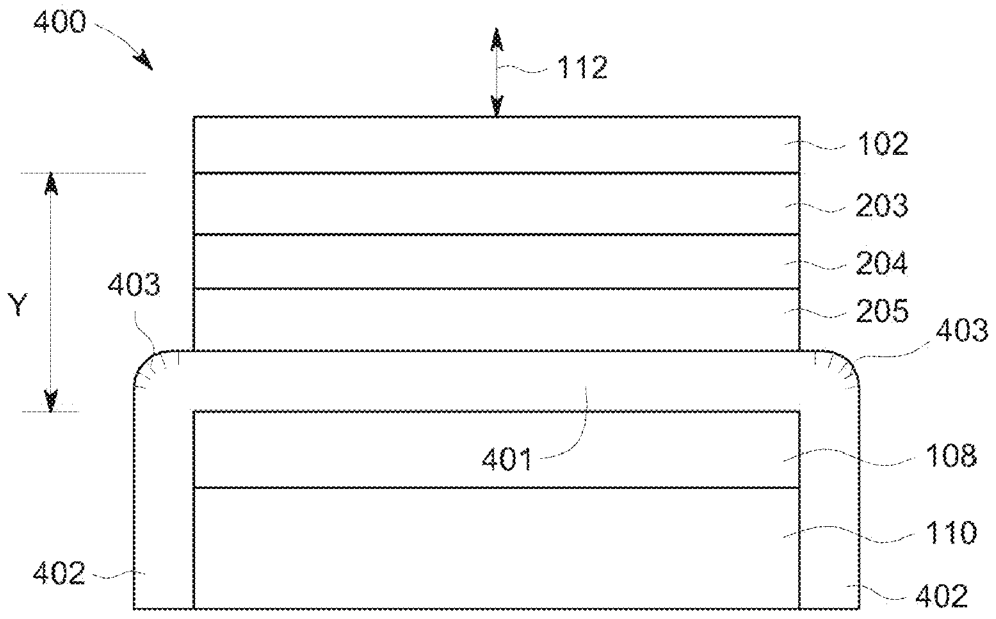
FIG. 4 depicts a cross-section of layers of an ultrasound transducer used in accordance with embodiments of the present technology.

FIG. 4 depicts a cross-section of layers of an ultrasound transducer 400 used in accordance with embodiments of the present technology. Transducer 400 is configured similar to transducer 200 depicted in FIG. 2A. However, transducer 400 includes matching layer 401 in place of matching layer 206. Matching layer 401 is disposed between piezoelectric element 108 and matching layer 205, and can comprise a material and thickness similar to matching layer 206 depicted in FIG. 2A. Matching layer 401 includes wings 402 that extend beyond the ends of piezoelectric element 108 to backing 110.

Wings 402 can be formed by providing matching layer 401 such that it extends beyond the ends of piezoelectric element 108. A plurality of notches 403 can be provided in a surface of matching layer 401, and the portions of matching layer 401 that extend beyond the ends of piezoelectric element 108 can be folded away from notches 403 toward piezoelectric element 108 and backing 110 such that the notches 403 are disposed at and/or around outer elbows of the folds as shown in FIG. 4. The folding operation can be complete once wings 402 are provided about the ends of piezoelectric element 108 and backing 110.

Wings 402 are configured to conduct heat from piezoelectric element 108 to a heat sink and/or thermal management at backing 110. The relatively high thermal conductivity of matching layer 401 and wings 402 can aid in the desired heat transfer toward the backing 110 of transducer 400, and away from lens 102. Wings 402 can also form a ground for transducer 400 by connecting to the appropriate grounding circuit such as a flexible circuit that are usually placed between piezoelectric element 108 and backing 110. Wings 402 can also act as an electrical shielding for the transducer 400.

Figure 5:
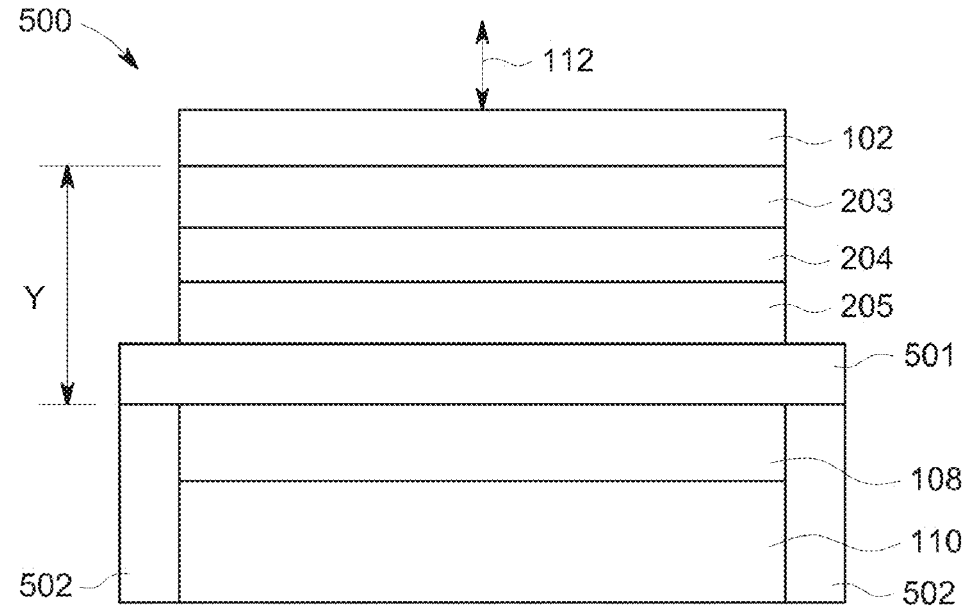
FIG. 5 depicts a cross-section of layers of an ultrasound transducer used in accordance with embodiments of the present technology.

FIG. 5 depicts a cross-section of layers of an ultrasound transducer 500 used in accordance with embodiments of the present technology. Transducer 500 is configured similar to transducer 200 depicted in FIG. 2A. However, transducer 500 includes matching layer 501 in place of matching layer 206. Matching layer 501 is disposed between piezoelectric element 108 and matching layer 205, and can comprise a material and thickness similar to matching layer 206 depicted in FIG. 2A. Matching layer 501 extends beyond the ends of piezoelectric element 108. For example, in an embodiment, matching layer 501 can extend beyond ends of piezoelectric element 108 by about one millimeter or less. Attached to the extended portions of matching layer 501 are sheets 502 that extend over ends of piezoelectric element 108 to backing 110. Sheets 502 can be attached to matching layer 501 using thermally conductive epoxy. Sheets 502 comprise material of relatively high thermal conductivity, such as the same material as matching layer 501, graphite and/or thermally conductive epoxy, for example. Sheets 502 are configured to conduct heat from piezoelectric element 108 to a heat sink and/or thermal management at backing 110. The relatively high thermal conductivity of matching layer 501 and sheets 502 can aid in the desired heat transfer toward the backing 110 of transducer 500, and away from lens 102.

Figure 6:
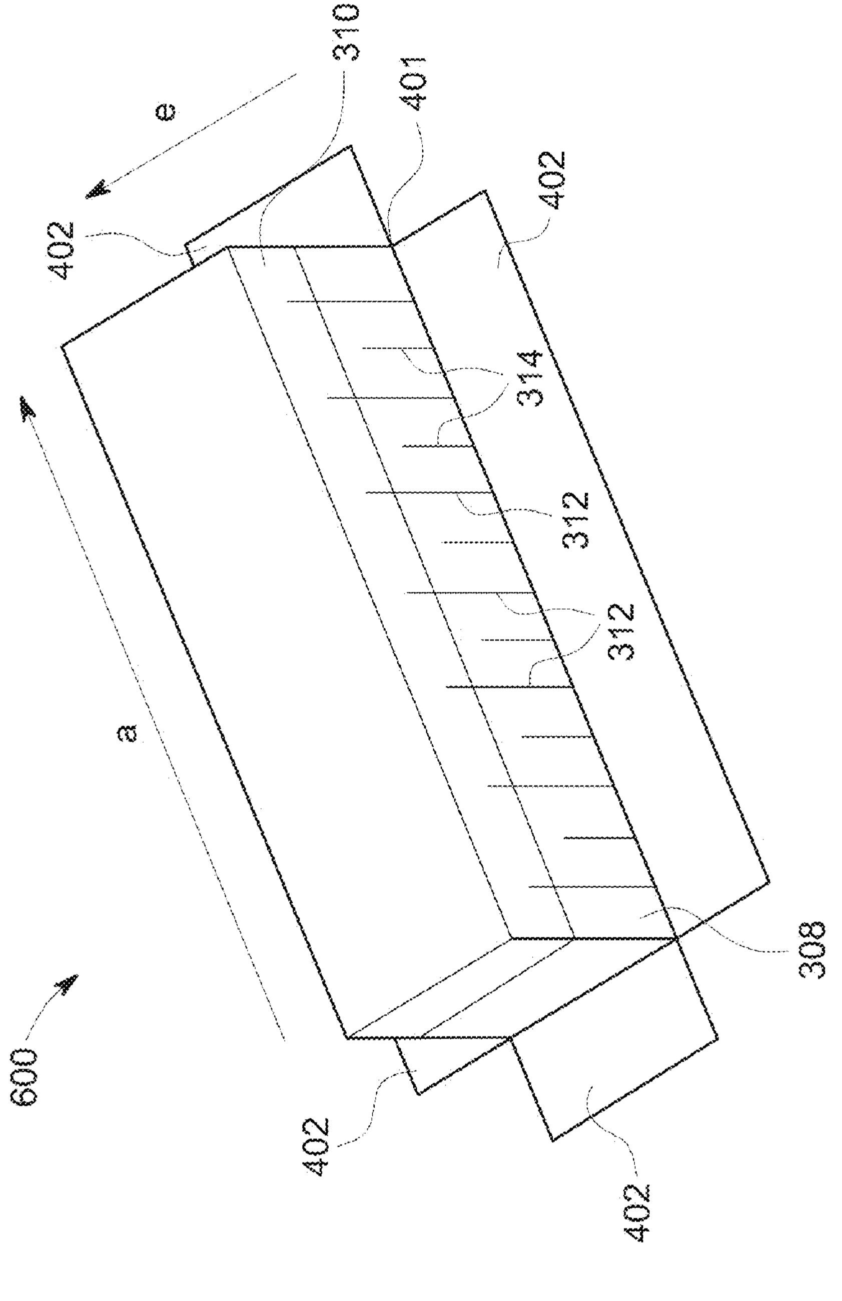
FIG. 6 depicts a perspective view of layers of an ultrasound transducer used in accordance with embodiments of the present technology.

FIG. 6 depicts a perspective view of an ultrasound transducer 600 used in accordance with embodiments of the present technology. Transducer 600 includes an impedance matching layer 401 with wings 402, piezoelectric element 308, and backing 310. Other impedance matching layers and lens are not depicted in FIG. 6. The depicted layers include major cuts 312 and minor cuts 314, which cuts are substantially perpendicular to azimuth direction (a) and substantially parallel to elevation direction (e). Major cuts 312 extend through matching layers, through piezoelectric element 308, and into backing 310. Minor cuts 314 extend through matching layers and partially through piezoelectric element 308. Minor cuts do not extend all the way through piezoelectric element 308, and do not extend into backing 310. Wings 402 are disposed about four sides of transducer 600 and would be folded toward piezoelectric element 308 and backing 310 such that wings 402 could conduct heat from piezoelectric element 308 to a heat sink and/or thermal management at backing 110. In other embodiments, wings 402 may be provided about one, two, three or four sides of a transducer. For example, in certain embodiments, wings 402 may only be provided along two opposing sides of a transducer, such that wings are disposed substantially perpendicular to cuts 312 and 314. In such embodiments, wings 402 extend along the azimuth direction (a) and not the elevation direction (e).

FIG. 7 depicts computer simulation results for an ultrasound transducer used in accordance with embodiments of the present technology. FIG. 7 depicts the results of a simulation study for a 3.5 MHz one-dimensional linear array transducer with three matching layers. The matching layer closest to the piezoelectric element (the first matching layer) comprises aluminum bar with an acoustic impedance of 13.9 MRayl. The second matching layer comprises filled epoxy with an acoustic impedance of 6.127 MRayl. The third matching layer comprises an undefined substance with an acoustic impedance of 2.499 MRayl (which could be plastic and/or an epoxy with fillers, such as silica fillers, for example). Given these acoustic impedances, the simulation indicates that the layers can have respective thicknesses of 0.2540 millimeters (aluminum bar) 0.1400 millimeters (filled epoxy), 0.1145 millimeters (undefined material). The computer simulation demonstrates that the distance from the inner matching layer to the outer matching layer (such as the distance y from matching layer 206 to 203 as depicted in FIG. 2) can be thinner than the matching layers in conventional transducers, such as the those depicted in FIG. 1 that can have a matching layer thickness of about ¼ the desired wavelength of transmitted ultrasound waves at the resonant frequency. Such simulations may use a KLM model, a Mason Model, and/or finite element simulation, for example, to determine desired characteristics.

Simulation for acoustic performance studies can be used to optimize matching layer characteristics such that matching layers with desired acoustic impedance and thermal conductivity are provided with minimal thickness, thereby allowing cutting operations to be performed more effectively.

Figure 8:
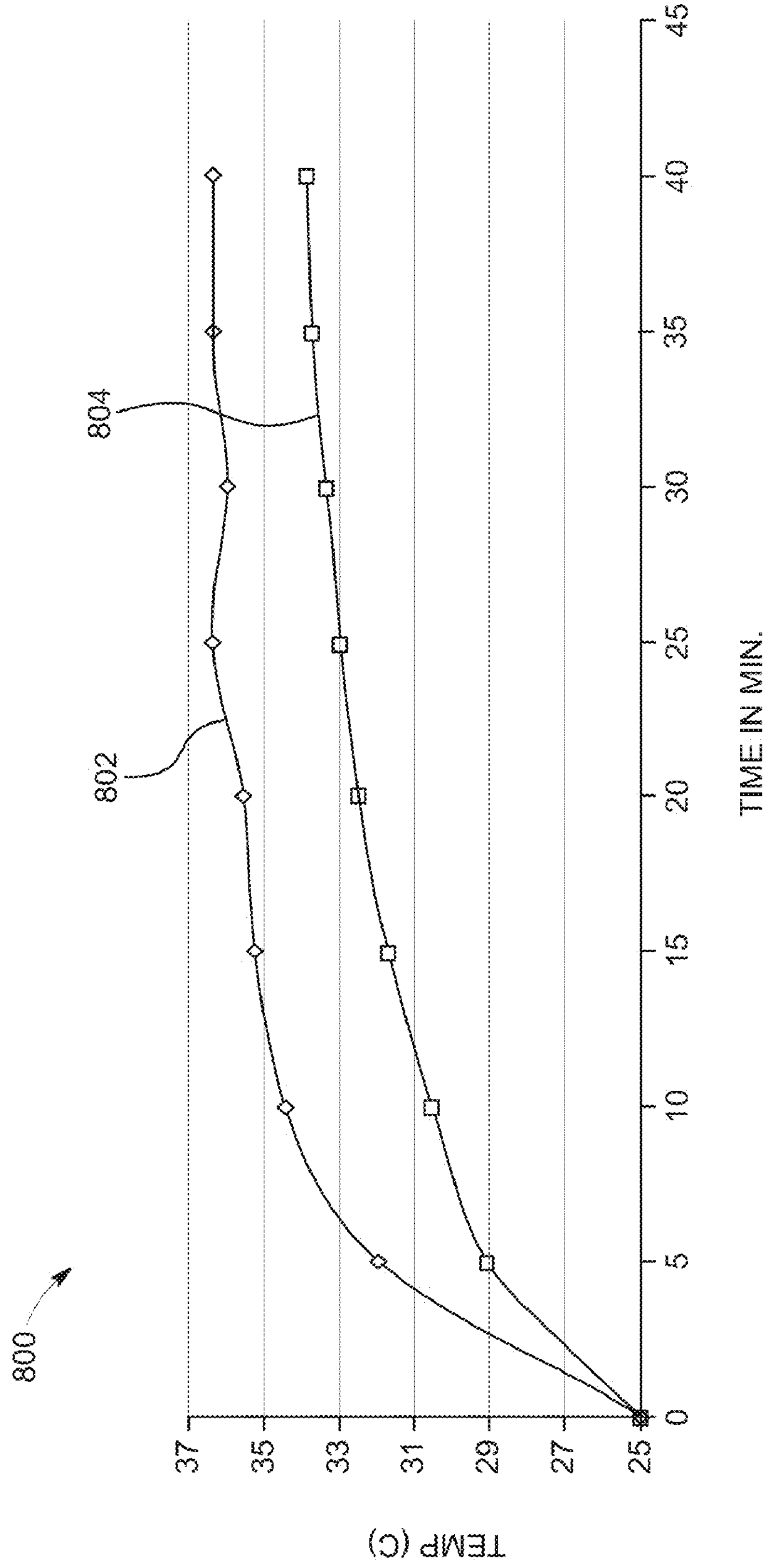
FIG. 8 is a graph depicting experimental results of temperature measurements at the lens surface for a conventional transducer and a transducer built in accordance with an embodiment of the present technology.

FIG. 8 is a graph 800 depicting experimental results of temperature measurements at the lens surface for a conventional transducer and a transducer built in accordance with an embodiment of the present technology. The graph plots temperature at the lens surface vs. time. The temperature measurements for the conventional transducer are indicated by line 802 and the temperature measurements for the transducer built in accordance with an embodiment of the present technology are indicted by line 804. During the experiment, both transducers were connected to an ultrasound system under the same conditions and settings. The transducer built in accordance with an embodiment of the present technology maintained a lens surface temperature that was about 3 to 4 degrees Celsius cooler than the conventional transducer over a 40 minute period.

Figure 9:
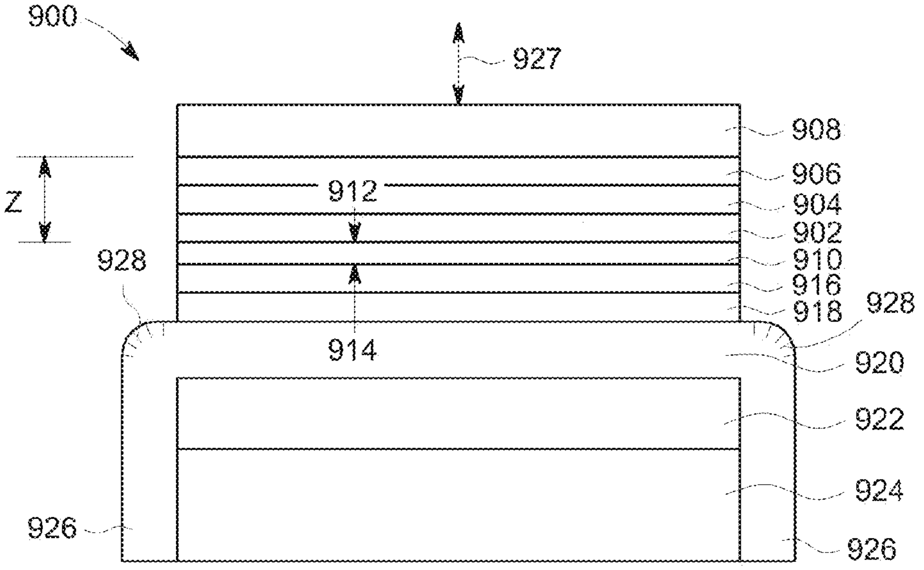
FIG. 9 depicts a cross-section of layers of an ultrasound transducer used in accordance with embodiments of the present technology.

FIG. 9 depicts a cross-section of layers of an ultrasound transducer 900. Transducer 900 includes three matching layers 902, 904, and 906 disposed between lens 908 and piezoelectric element 910. Other embodiments may include a different number of matching layers. For example, some embodiments may include only two matching layers, while other embodiments may include four or more matching layers. The piezoelectric element 910 can convert electrical signals into ultrasound waves directed at a target and can also convert received ultrasound waves into electrical signals. The piezoelectric element 910 is shaped to define a front side 912 and a back side 914. For purposes of this disclosure, the front side 912 is defined to include the side of the piezoelectric element 910 from which ultrasound waves are emitted towards the lens 908. The back side 914 is defined to include the side of the piezoelectric element 910 that is opposite of the front side 912 and facing away from the lens 908. The ultrasound transducer 900 includes a dematching layer 916 connected to the back side 914 of the piezoelectric element 910 and a flex 918 attached to the dematching layer 916. The piezoelectric element 910 may be a piezoelectric material like lead zirconate titanate (PZT) or a PZT composite material. According to other embodiments, the piezoelectric material may also include a single crystal, such as PMN-PT. The ultrasound transducer 900 also includes a backside matching layer 920, a thermal backing 922, and a heat sink 924.

In some embodiments, the matching layers 902, 904, and 906, the piezoelectric element 910, and the lens 908 may be bonded together using epoxy or other adhesive material cured under pressure, such as that supplied by tooling including a press machine. Arrows 927 depict ultrasound waves transmitted from and received at ultrasound transducer 900. The received ultrasound waves may be used by an ultrasound system to generate an image of the target.

The matching layer 902, 904, and 906 are disposed between the piezoelectric element 910 and the lens 908 in order to increase the energy of the waves transmitted from the ultrasound transducer 900. Each of the matching layers 902, 904, and 906 may be made of epoxy and one or more different fillers. The fillers may be used to adjust the acoustic impedance of each of the matching layers 902, 904, and 906 according to an embodiment. The embodiment shown in FIG. 10 includes three matching layers, but other embodiments may have either fewer matching layers or additional matching layers. For example, other embodiments may have a single matching layer, two matching layers, or more than three matching layers in place of the matching layers 902, 904, and 906 shown in FIG. 9.

As described previously, the thickness of each of the three matching layers 902, 904, and 906 may be ¼ or less of the wavelength at the resonant frequency of the ultrasound transducer 900. However, according to other embodiments, the matching layers 902, 904, and 906 may be more than ¼ of the wavelength at the resonant frequency of the ultrasound transducer 900. For example, one or more of the matching layers may be approximately ½ of the wavelength at the resonant frequency according to an embodiment. The acoustic impedance of each matching layer 902, 904, and 906 may be selected to reduce the mismatch of acoustic impedances between the piezoelectric element 910 and the lens 908. The matching layers 902, 904, and 906 result in less reflection and/or refraction of ultrasound waves between the piezoelectric element 910 and the lens 908. The lens 908 may have an acoustic impedance of approximately 1.5 MRayl and the piezoelectric element 910 may have an acoustic impedance of 30 MRayl. According to other embodiments, the lens 908 may have an acoustic impedance anywhere in the range of 1.2 MRayl to 1.6 MRayl and the piezoelectric element 910 may have an acoustic impedance anywhere in the range of 20 MRayl to 40 MRayl. The first matching layer 902 may have an acoustic impedance of 10-20 MRayl, the second matching layer 904 may have an acoustic impedance of 5-15 MRayl, and the third matching layer 906 may have an acoustic impedance of 2-8 MRayl.

Each of the matching layers 902, 904, and 906 may be approximately ¼ of the desired wavelength or less in order to minimize destructive interference caused by waves reflected from the boundaries between each of the matching layers 902, 904, and 906. Each of the matching layers 902, 904, and 906 may comprise a metal, such as copper, copper alloy, copper with graphite pattern embedded therein, magnesium, magnesium alloy, aluminum, aluminum alloy, filled epoxy, glass ceramic, composite ceramic, and/or macor, for example.

In an embodiment, acoustic impedance of matching layers 902, 904, and 906 decreases as the matching layers 902, 904, and 906 increase in distance from piezoelectric element 910. That is, first matching layer 902 can have a higher acoustic impedance than second matching layer 904, and second matching layer 904 can have a higher acoustic impedance than third matching layer 906. According to an embodiment, each of the matching layers 902, 904, and 906 may have a relatively high thermal conductivity, such as greater than 30 W/mK.

The dematching layer 916 has a higher acoustic impedance than the piezoelectric element 910 in order to increase the power of the ultrasound waves transmitted to the lens 908. According to an embodiment, the dematching layer 916 may be made of a metal such as, for example, carbide alloy, with an acoustic impedance of 40 MRayl to 120 MRayl according to an exemplary embodiment. The acoustic impedance of the dematching layer 916 is relatively high in order to acoustically "clamp" the piezoelectric element so that most of the acoustic energy is transmitted out the front side 912 of the piezoelectric element 910. It should be appreciated that other embodiments may use a dematching layer made from a different material and/or with an acoustic impedance selected from a different range. In still other embodiments, the ultrasound transducer may not have a dematching layer.

The backside matching layer 920 is attached to the flex 918. The backside matching layer 920 may be aluminum according to an embodiment, but other thermally conductive materials, including aluminum alloys, copper, copper alloys and other metals may also be used.

The backside matching layer 920 is indirectly connected to the piezoelectric element 910 via the flex 918 and the dematching layer 916. For purposes of this disclosure, the term "indirectly connected" is defined to include two structures connected to each other via one or more additional structures or components. According to an embodiment, the piezoelectric element 910, the dematching layer 916, and the flex 918 may be bonded together with a thermally conductive material, such as an epoxy with conductive additives. Heat is conducted from the piezoelectric element 910, through the dematching layer 916, through the flex 918, to the backside matching layer 920. According to an embodiment, the flex 918 may be relatively thin, such as around 100 μm or less. Even though the flex 918 may comprise copper traces with an insulating polyimide layer, heat is still effectively transferred from the dematching layer 916 through the flex 918 to the backside matching layer 920 due to the thinness of the flex 918. Additional details about the backside matching layer 920 will be described hereinafter.

Even though the dematching layer 916 eliminates a large percentage of the acoustic energy emitted from the backside of the piezoelectric element 910, some acoustic energy may still be transmitted through the dematching layer 916, the flex 918, and the backside matching layer 920. In order to damp this acoustic energy, the ultrasound transducer 900 includes a thermal backing 922. The thermal backing 922 is made from a material with relatively high acoustic attenuation so that it can attenuate ultrasound waves from piezoelectric element 910. For example, the thermal backing 922 may be made of epoxy with a filler such as titanium dioxide. The thermal backing 922 may be approximately 2 mm thick. In other embodiments, the thermal backing 922 may be between 1 mm to 20 mm thick. However, when the thermal backing 922 is made of epoxy with a filler, it tends to have a relatively low thermal conductivity—for example, the thermal conductivity of epoxy with titanium dioxide is generally less than 10 W/m.K.

The heat sink 924 is attached to the thermal backing 922 and comprises a material with a high specific heat capacity such as aluminum or an aluminum alloy. Since heat is not effectively conducted through the thermal backing 922, the backside matching layer 920 includes wings 926 extending beyond an edge of the piezoelectric element 910. The wings 926 may be folded so that they contact the heat sink 924. The wings 926 may be connected to the heat sink 924 by a thermally conductive epoxy, solder, or any other technique that would result in a thermally conductive joint. For purposes of this disclosure, the term "thermally conductive" is defined to include a conductive connection that transfers heat at a rate of at least 10 W/m.K. However, the conductive connection would preferably transfer heat at a rate of greater than 20 W/m.K. According to an exemplary embodiment, the backside matching layer 920 may include a plurality of notches 928 in the front side surface of the backside matching layer 920 in order to facilitate the folding of the backside matching layer 920 to a position in contact with the heat sink 924.

According to an embodiment, the depicted layers may include a plurality of major cuts (not shown) through the matching layers 902, 904, and 906, and the piezoelectric element 910 in order to provide electrical separation between portions of the piezoelectric element 910. Additionally, the depicted layers may include a plurality of minor cuts through the matching layers 902, 904, and 906 and a portion of the piezoelectric element 910 in order to effectively damp horizontal vibration.

Figure 10:
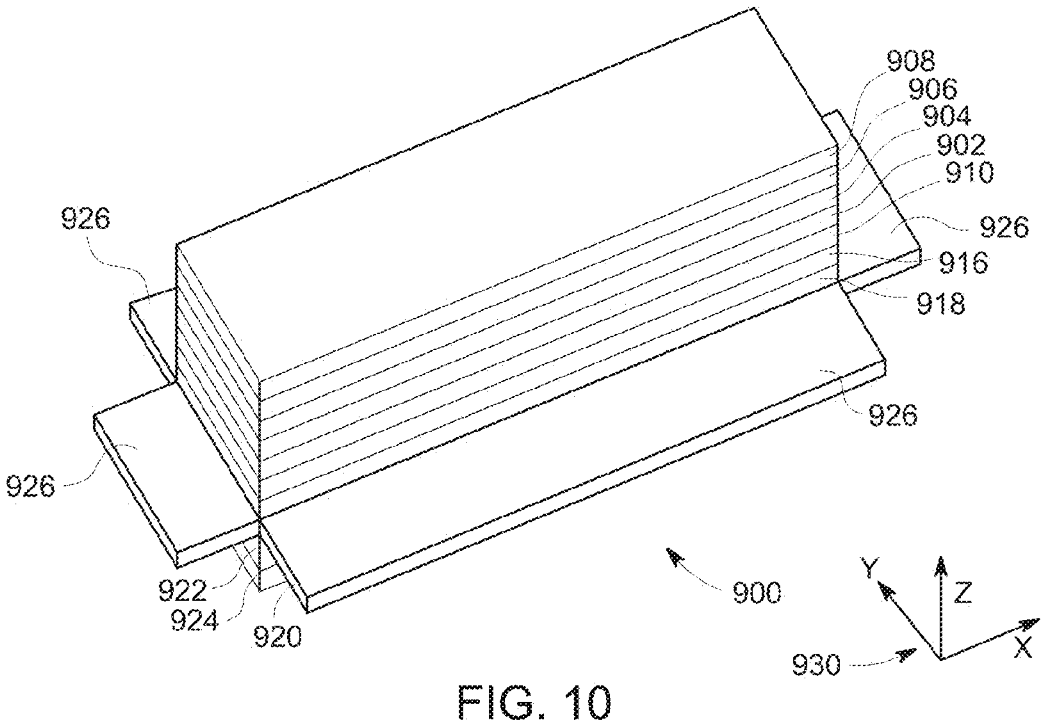
FIG. 10 depicts a perspective view of an ultrasound transducer used in accordance with embodiments of the present technology.

FIG. 10 is a perspective view of the ultrasound transducer 900 shown in FIG. 9. Common reference numbers are used to identify components that are common between FIGS. 9 and 10. FIG. 10 illustrates the wings 926 in an extended position before they are folded down to make contact with the heat sink 924. The cross-sectional view of FIG. 9 only shows two of the 4 wings 926. In FIG. 10, it is apparent that that backside matching layer 920 includes four wings 926. A coordinate axis 930 is also shown in FIG. 10. The embodiment shown in FIG. 10 includes wings 926 extending in both the positive and negative x-directions from the ultrasound transducer 900 as well as both the positive and negative y-directions from the ultrasound transducer 900.

The backside matching layers of other embodiments may include fewer than four wings. For example, an embodiment (not shown) may have a matching layer with only two wings. If an embodiment has only two wings, it may be advantageous for the wings to be disposed substantially parallel to any cuts made during a dicing operation. That is, if the dicing cuts are in a y-direction, it may be advantageous to have the wings extend in the positive and negative y-direction so that there are undiced portions of the piezoelectric element 910 offering good thermal pathways from a piezoelectric element 910 to the wings 926.

According to embodiments with four wings 926, such as that shown in FIG. 10, any gaps created during a dicing operation may be filled with a substance like RTV or epoxy that is thermally conductive but electrically insulating. By filling in cuts made during a dicing operation, heat is able to flow from the piezoelectric element 910, through the backside matching layer 920, to the heat sink 924. It should be appreciated by those skilled in the art that the wings 926 shown in FIG. 10 would be thermally connected to the heat sink 924 before the ultrasound transducer 900 would be used. Additionally, it should be appreciated that other embodiments may have one or more wings disposed substantially perpendicular to any cuts made during a dicing operation.

Figure 11:
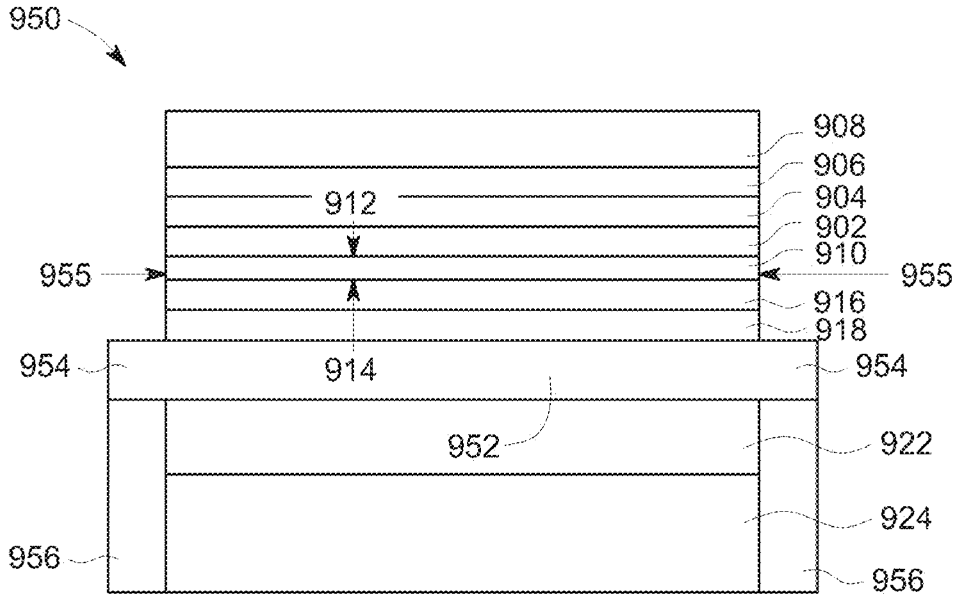
FIG. 11 depicts a cross-section of layers of an ultrasound transducer used in accordance with embodiments of the present technology.

FIG. 11 depicts a cross-section of layers of an ultrasound transducer 950. Common referent numbers are used to identify components that are substantially identical to components that were previously described with respect to FIG. 9. Components that have been previously described will not be described again in detail. The ultrasound transducer 950 includes a backside matching layer 952 including two portions 954 that extend beyond an end 955 of the piezoelectric element 910. A thermally conductive sheet 956 thermally connects each portion 954 to the heat sink 924. As with the embodiment shown in FIG. 9, the backside matching layer 952 is configured to conduct heat to the heat sink 924. The backside matching layer 952 may be aluminum or an aluminum alloy according to an exemplary embodiment. The thermally conductive sheets 956 may also be aluminum or an aluminum alloy. The thermally conductive sheets 956 may be directly connected to the backside matching layer 952 or bonded to the backside matching layer 952 with a material such as thermally conductive epoxy or solder.

In certain embodiments, the techniques described herein can be applied in connection with one-dimensional linear array transducers, two-dimensional transducers and/or annular array transducers. In certain embodiments, the techniques described herein can be applied in connection with a transducer of any geometry.

Figure 12:
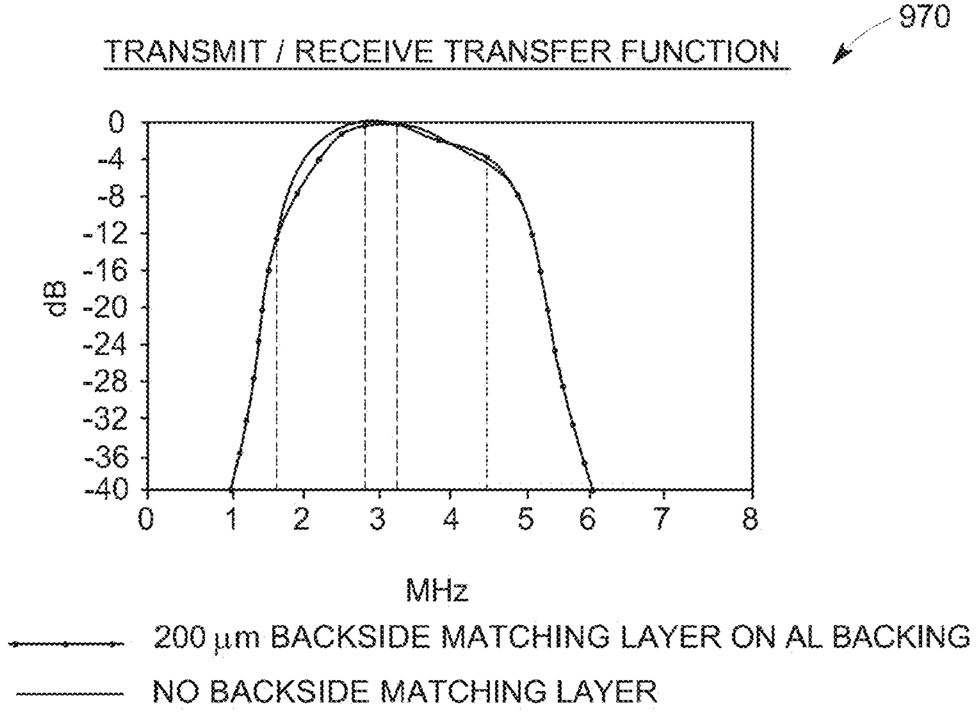
FIG. 12 depicts a graph showing simulation data.

FIG. 12 depicts a graph showing simulation data. The graph 970 shows the transmit/receive transfer functions for both a conventional ultrasound transducer without a backside matching layer and an ultrasound transducer in accordance with an embodiment with a 200 μm backside matching layer on an Aluminum backing. The plot of the conventional ultrasound transducer is represented by a line, while the plot of the ultrasound transducer with the backside matching layer is represented by a line with dots. For portions of the spectrum where the two plots are the same, only the line with the dots is visible on the graph 970. The transmit/receive transfer functions are nearly identical over most of the frequencies. The transmit/receive transfer functions are distinct from 1.5 MHz to 2.8 MHz and from 3.2 MHz to 4.5 MHz. For all other frequencies, the transmit/receive transfer functions for the ultrasound transducer in accordance with an embodiment and the conventional ultrasound transducer are indistinguishable from the graph 970. The similarities between the graphs of the transmit/receive transfer functions for the transducer in accordance with an embodiment and the conventional ultrasound transducer indicate that the acoustic performance of the ultrasound transducer in accordance with an embodiment is very close to the acoustic performance of a conventional ultrasound transducer. This simulation demonstrates that the acoustic performance of the ultrasound transducer in accordance with an embodiment is not hindered by the inclusion of a backside matching layer.

Figure 13:
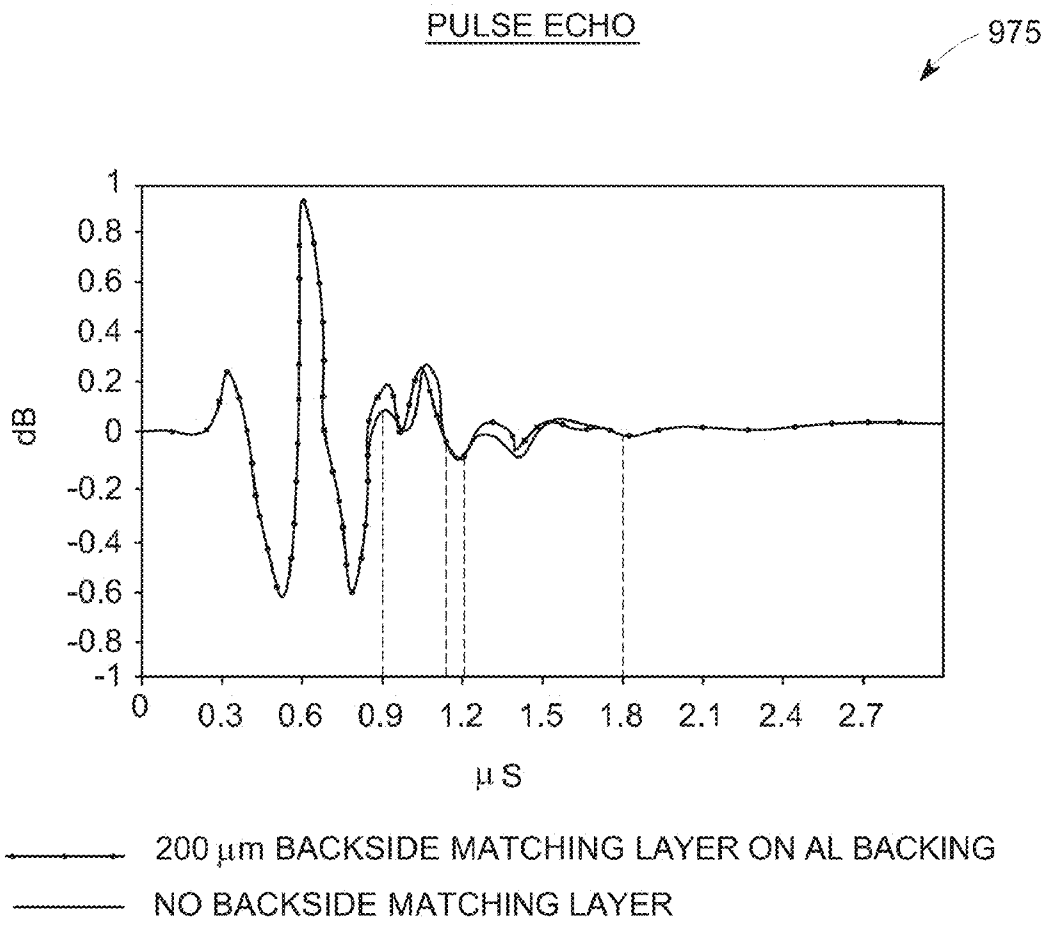
FIG. 13 depicts a graph showing simulation data.

FIG. 13 depicts a graph showing simulation data. The graph 975 shows the pulse echoes for both a conventional ultrasound transducer without a backside matching layer and an ultrasound transducer in accordance with an embodiment with a 200 μm backside matching layer on an Aluminum backing. The plot of the conventional ultrasound transducer is represented by a line, while the plot of the ultrasound transducer with the backside matching layer is represented by a line with dots. For portions of the spectrum where the two plots are the same, only the line with the dots is visible on the graph 975. The pulse echoes for both the conventional ultrasound transducer and the ultrasound transducer in accordance with an embodiment are nearly identical. The pulse echoes differ from approximately time 0.9 s to time 1.1 s and from just after time 1.2 s to nearly 1.8 s. At all other times depicted on the graph 975, the pulse echoes for the conventional ultrasound transducer and the pulse echoes for the ultrasound transducer in accordance with an embodiment are indistinguishable based on the graph 975. This indicates that the acoustic performance of the ultrasound transducer in accordance with an embodiment is very similar to the conventional ultrasound transducer, and that the inclusion of a backside matching layer does not hurt the acoustic performance of the ultrasound transducer in accordance with an embodiment.

Applying the techniques herein can provide a technical effect of improving acoustic properties and/or thermal characteristics. For example, directing heat away from a transducer lens can allow the transducer to be used at increased power levels, thereby improving signal quality and image quality.

The inventions described herein extend not only to the transducers described herein, but also to methods of making such transducers.

While the inventions have been described with reference to embodiments, it will be understood by those skilled in the art that various changes may be made and equivalents may be substituted without departing from the scope of the inventions. In addition, many modifications may be made to adapt a particular situation or material to the teachings of the inventions without departing from their scope. Therefore, it is intended that the inventions not be limited to the particular embodiments disclosed, but that the inventions will include all embodiments falling within the scope of the appended claims.

The invention claimed is:

1. An ultrasound transducer comprising:

a piezoelectric element defining a front side and a back side, the piezoelectric element configured to convert electrical signals into ultrasound waves to be transmitted from the front side toward a target, the piezoelectric element configured to convert received ultrasound waves into electrical signals;

a lens connected to the front side of the piezoelectric element;

a heat sink connected to the back side of the piezoelectric element;

a backside matching layer connected to both the piezoelectric element and the heat sink, the backside matching layer comprising a wing configured to extend beyond an end of the piezoelectric element to the heat sink, wherein the backside matching layer is configured to conduct heat from the piezoelectric element to the heat sink.

2. The ultrasound transducer of claim 1, further comprising a thermal backing disposed between the backside matching layer and the heat sink, wherein the thermal backing is configured to attenuate ultrasound waves from the piezoelectric element.

3. The ultrasound transducer of claim 1, further comprising a thermally conductive sheet attached to the wing and the heat sink.

4. The ultrasound transducer of claim 3, wherein the thermally conductive sheet is attached to the wing and the heat sink by epoxy.

* * * * *